(12) United States Patent
Shahar et al.

(10) Patent No.: US 9,797,061 B2
(45) Date of Patent: Oct. 24, 2017

(54) SYSTEMS FOR CRYSTAL GROWTH UTILIZING FURNACES, AMPOULES, AND CRUCIBLES

(71) Applicant: General Electric Company, Schenectady, NY (US)

(72) Inventors: Arie Shahar, Moshav Magshimim (IL); Eliezer Traub, Ramat-Gan (IL); Peter Rusian, Ashdod (IL); Juan Carlos Rojo, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 33 days.

(21) Appl. No.: 14/928,740

(22) Filed: Oct. 30, 2015

(65) Prior Publication Data

US 2016/0122896 A1 May 5, 2016

Related U.S. Application Data

(62) Division of application No. 13/308,151, filed on Nov. 30, 2011, now Pat. No. 9,206,525.

(51) Int. Cl.
*C30B 11/00* (2006.01)
*C30B 29/48* (2006.01)

(52) U.S. Cl.
CPC ............ *C30B 11/003* (2013.01); *C30B 29/48* (2013.01); *Y10T 117/1092* (2015.01)

(58) Field of Classification Search
CPC ..... C30B 11/00; C30B 11/001; C30B 11/002; C30B 11/003; C30B 11/006; C30B 11/14; C30B 29/10; C30B 29/46; C30B 29/48; Y10T 117/00; Y10T 117/10; Y10T 117/1004; Y10T 117/1008; Y10T 117/1016; Y10T 117/1024; Y10T 117/1092; Y10T 117/1096; F27B 14/00; F27B 14/08; F27B 14/0825; F27B 14/0831; F27B 14/0837; F27B 14/0893; F27B 14/10; F27B 14/102; F27B 14/104
USPC .......... 117/11, 73–74, 81–83, 200–202, 204, 117/206, 223–224, 937, 956
See application file for complete search history.

(56) References Cited

U.S. PATENT DOCUMENTS

| 4,118,197 A | 10/1978 | Mackintosh et al. |
| 5,047,112 A | 9/1991 | Ciszek |
| 5,116,456 A | 5/1992 | Nestor |
| 5,370,078 A | 12/1994 | Kou et al. |
| 5,650,008 A | 7/1997 | Kou et al. |

(Continued)

FOREIGN PATENT DOCUMENTS

WO WO 2011/027992 A2 * 3/2011

*Primary Examiner* — Kenneth A Bratland, Jr.
(74) *Attorney, Agent, or Firm* — Dean D. Small; The Small Patent Law Group, LLC (57) ABSTRACT

A system for growing a crystal is provided that includes a crucible, a furnace, and a heat transfer device. The crucible has a first volume to receive therein a material for growing a crystal. The furnace has an ampoule configured to receive the crucible within the ampoule. The furnace is configured to produce a lateral thermal profile combined with a vertical thermal gradient. The heat transfer device is disposed under the crucible and configured to produce a leading edge of growth of the crystal at a bottom of the crucible. The heat transfer device includes at least one elongate member disposed beneath the crucible and extending along a length of the crucible.

11 Claims, 7 Drawing Sheets

(56) References Cited

U.S. PATENT DOCUMENTS

| | | |
|---|---|---|
| 6,325,849 B1 | 12/2001 | Hideo et al. |
| 6,544,357 B1 | 4/2003 | Hehmann et al. |
| 6,896,729 B2 | 5/2005 | Liu et al. |
| 2002/0144649 A1 | 10/2002 | Mackintosh et al. |
| 2003/0172870 A1* | 9/2003 | Liu ................ C30B 11/003 117/200 |
| 2007/0209579 A1 | 9/2007 | Sasaura et al. |
| 2008/0022923 A1 | 1/2008 | Kordina et al. |
| 2008/0026591 A1 | 1/2008 | Kordina et al. |
| 2008/0053372 A1 | 3/2008 | Anttila et al. |
| 2008/0257254 A1* | 10/2008 | Linke ................ C01B 33/037 117/15 |
| 2009/0249994 A1 | 10/2009 | Liu et al. |
| 2010/0116196 A1 | 5/2010 | Liu |
| 2011/0143091 A1 | 6/2011 | Liu et al. |
| 2012/0174857 A1* | 7/2012 | Ahn ................ C30B 11/00 117/81 |

\* cited by examiner

Fig. 15

SYSTEMS FOR CRYSTAL GROWTH UTILIZING FURNACES, AMPOULES, AND CRUCIBLES

CROSS-REFERENCE TO RELATED APPLICATIONS

This application is a divisional application of, and claims benefit to the filing date of, U.S. patent application Ser. No. 13/308151, filed Nov. 30, 2011, entitled "Method for Configuring a System to Grow a Crystal by Coupling a Heat Transfer Device Comprising At Least One Elongate Member Beneath a Crucible," the entire disclosure of which is incorporated by reference herein.

BACKGROUND OF THE INVENTION

The subject matter disclosed herein relates generally to growing crystals, such as crystal growth including a Modified Horizontal Bridgeman (MHB) method.

Growing crystals using the MHB method may be performed by moving a furnace having a fixed temperature profile along a horizontal crucible that contains, at a first step of the growth, a melted material. Alternatively, the MHB may be performed by moving a controlled temperature profile in a fixed furnace along the crucible. In both of these methods, the temperature profile typically includes three zones: the first zone having a temperature that is higher than the melting temperature of the grown material, the second intermediate zone is a transition zone in which the temperature is changed gradually from the temperature of the first zone to that of the third zone and the third zone having a temperature below the melting temperature of the grown material.

The relative movement between the crucible and the temperature profile causes the melted material to gradually change temperature from being above a melting point to be below the melting point of the material. Accordingly, the phase transition of the grown material is controlled to be gradual and slow enough to allow the material to solidify by a crystallization process to produce a solid material in the form of a crystal.

During the crystallization, the conventional process may start in several nucleation (crystallization) centers in which each nucleation center may be in a different crystal-orientation and may have a different potential energy. In crystals that have a preferred crystal-orientation having potential energy that is significantly lower than the potential energy of the other crystal-orientations, the preferred orientation may take over the other crystal-orientations and the grown crystal may be close to a single crystal.

However, in crystals, such as a Cadmium Zinc Telluride (CdZnTe or CZT) crystal, there is no crystal-orientation and these crystals have a significantly lower potential energy. Accordingly, the growth of the crystal that may start with several nucleation centers may continue to grow with several crystal-orientations, resulting in a polycrystalline grown boule (ingot) having multiple grains and a poor crystalline quality for some applications, such as for detectors for imaging applications.

BRIEF DESCRIPTION OF THE INVENTION

In one embodiment, a method for configuring a system to grow a crystal is provided. The method includes providing a crucible having a first volume to receive therein a material for growing a crystal and configuring a furnace to contain the crucible and to produce a lateral thermal profile. The lateral thermal profile has a first zone, a second zone and a third zone, wherein the first and second zones have temperatures above and below a melting point of the material, respectively, and the second zone has a temperature equal to the melting point of the material and containing a solid-liquid interface of the material. The method further includes configuring the furnace to also produce a vertical thermal gradient and combine the lateral thermal profile with the vertical thermal gradient, wherein the vertical thermal gradient causes a point in a bottom of the crucible located in the third zone to be the coldest point in the crucible. The method also includes configuring a heat transfer device for coupling to the crucible to transfer heat from the third and second zones to the first zone to produce a leading edge of the interface to create substantially a single nucleation center in the leading edge.

In another embodiment, a system for growing a crystal is provided that includes a crucible having a first volume to receive therein a material for growing a crystal and a furnace configured to receive the crucible therein. The furnace is also configured to produce a lateral thermal profile combined with a vertical thermal gradient. The system further includes a heat transfer device under the crucible configured to produce a leading edge of growth of the crystal at a bottom of the crucible.

In a further embodiment, a method of growing a crystal is provided. The method includes producing a lateral thermal profile in a furnace having a crucible therein containing a material for growing a crystal. The lateral thermal profile has a first zone, a second zone and a third zone, wherein the first and second zones have temperatures above and below a melting point of the material, respectively, and the second zone has a temperature equal to the melting point of the material and containing a solid-liquid interface of the material. The method further includes producing in the furnace a vertical thermal gradient and combining the lateral thermal profile with the vertical thermal gradient, wherein the vertical thermal gradient causes a point in a bottom of the crucible located in the third zone to be the coldest point in the crucible. The method also includes transferring heat from the third and second zones to the first zone using to produce a leading edge of the interface to create substantially a single nucleation center in the leading edge.

DETAILED DESCRIPTION OF THE INVENTION

The following detailed description of certain embodiments will be better understood when read in conjunction with the appended drawings. To the extent that the figures illustrate diagrams of the blocks of various embodiments, the blocks are not necessarily indicative of the division between hardware or components. Thus, for example, one or more of the blocks may be implemented in a single piece of hardware or component or multiple pieces of hardware or components. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Described herein are various embodiments for growing crystals. By practicing at least one embodiment, crystal growth is controlled by reducing the number of crystallization centers to a single crystallization center or substantially a single crystallization center and to maintain the crystal-orientation of the growth of such nucleation center to produce high quality crystalline in which the crystal has substantially one dominant crystal-orientation.

The number of crystallization centers that the growth may start with and continue with depends, for example, on the shape of the moving temperature profile, the shape of the crucible, irregularities in the interface between the melted material and the crucible internal surface, temperature inhomogeneity and fluctuations in the growing furnace.

In general, some embodiments provide systems and methods for Modified Horizontal Bridgeman (MHB) crystal growth to form a temperature profile that enhances the growth of one of the nucleation centers of a grown crystal and to maintain the crystal-orientation thereof, at least along part of the growth-axis of the crystal. For example, in some embodiments, a Cadmium Zinc Telluride (CdZnTe or CZT) crystal may be grown. However, any type of crystal or crystal structure may be grown by one or more embodiments described herein. Some embodiments include a heat guide, radiation guide and/or reduced isolation, at least in part of a furnace. The heat guides may be provided with different heat conductivities and that are made, for example, of pyro-lithic Graphite, Silicon-Carbon or Boron-Nitride, among other materials.

In some embodiments, radiation guides have shapes of channels and hollow pipes that are at least partially made of materials having polished emitting surfaces. For example, the radiation guides may be made of Quartz, among other materials. Additionally, the crucible for MHB may be provided having a shape that enhances one of the nucleation centers of the grown crystal to maintain the growth of the crystal-orientation, at least along part of the growth-axis of the grown crystal. The crucible may be made, for example, of Born-nitride, Quartz or Silicon-Carbide, among other materials. The crucible may have one of a plurality of different shapes along a bottom thereof to enhance the growth of substantially one crystal-orientation. In various embodiments, the shape along the bottom is narrower than the rest of the crucible.

Specifically, various embodiments provide crystal growth as described below. The growth of the crystal is controlled through a plurality of temperature zones. For example, crystal growth is initiated at a single nucleation center and maintained along a single crystal orientation. FIGS. 1-14 illustrate various embodiments for crystal growth. These figures generally illustrate embodiments of furnace and crucible structures, the lateral and vertical thermal profiles that such furnaces produce, the way that the solid-liquid interface of the growth is produced by such furnace, the heat transfer device used, a modified structure of the furnace designed to produce controlled heat loss and the modified structures of the crucibles.

Figure 1:
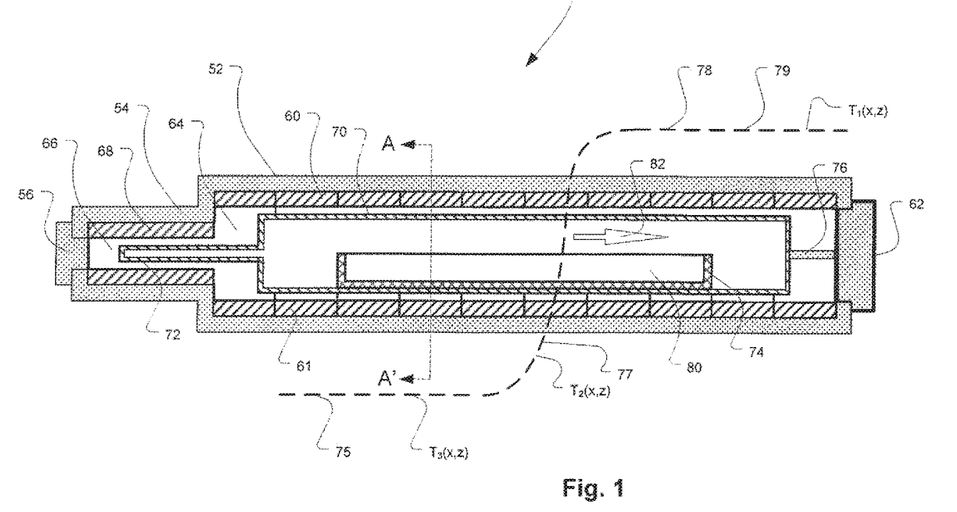
FIGS. 1 and 2 are diagrams schematically illustrating a furnace structure in accordance with various embodiments used to produce a vertical thermal gradient for Modified Horizontal Bridgeman (MHB) crystal growth.
Figure 2:
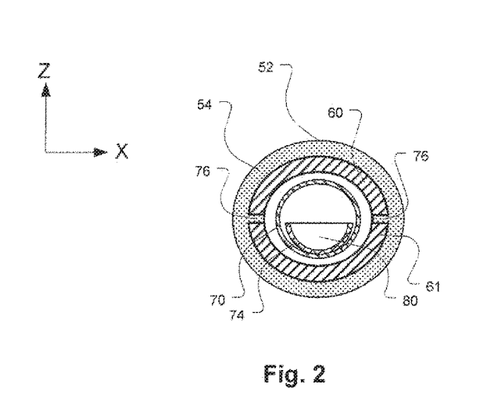

Various embodiments provide structures and methods that affect crystalline growth, such as by shaping the interface between the solid and liquid parts of the grown material. FIGS. 1 and 2 illustrate a furnace 50 according to various embodiments. The furnace 50 is configured to move a temperature profile 78 (also referred to as a thermal profile 78) as described in more detail below, as well as to provide a vertical temperature gradient.

The furnace 50 includes two zones 64 and 66. The zone 64 has higher temperatures than the temperatures of the zone 66 and includes upper heating elements 60 and lower heating elements 61. The temperatures of the heating elements 60 and 61 may be controlled electrically, for example, by closed loops including electronic controllers (not shown) and thermocouples (not shown) that measure the temperatures in different locations inside the furnace 50 (e.g., within one or more locations within the zones 64 and 66). The electronic controllers together with the data provided by the thermocouples produce the thermal profile 78 and move the profile along a growth direction 82 (as illustrated by the arrow in FIG. 1).

The zone 66 includes a heating element 68 that has a temperature that is adjusted to produce a desired vapor pressure when one of the elements of the grown material (e.g., compound) is inserted into a finger 72 (which may define an inlet) of an ampoule 70 (such as any suitable sealed vial). By modifying the temperature of the heating element 68, the stoichiometry of the grown crystal is determined.

The upper heating elements 60, lower heating elements 61 and heating element 68 may all be surrounded by a thermal isolation material 54 in various embodiments, which is surrounded by a furnace envelope 52. To reduce or prevent heat loss from the side edges of the furnace 50, isolation covers 56 and 62 may be provided that seal the edges of furnace 50. A crucible 74 having an internal volume 80, in which the crystal is grown, is placed inside the sealed ampoule 70. Additionally, the gap between the upper heating elements 60 and lower heating elements 61 is filled by a thermal isolation material 76, which may be any suitable material.

FIG. 2 is a side-view cross-section of the furnace 50 cut along lines A-A' of FIG. 1. FIG. 2 shows the envelope 52 of the furnace 50, the thermal isolation material 54, the upper heating and lower heating elements 60 and 61, respectively, the ampoule 70, the crucible 74 and the internal volume 80 thereof, and the thermal isolation material 76 between the upper and lower heating elements 60 and 61, respectively.

In operation, the heating elements 60 and 61 are controlled to produce a lateral thermal profile T(x) 78 along the growth direction 82 oriented along the X-axis. At the same time, the temperature of each upper heating element 60 is maintained to be higher than the temperature of the corresponding lower heating element 61 for producing a vertical thermal gradient in the Z-direction.

The vertical thermal gradient produces the thermal profile 78 T(X), which illustrates that the temperature T versus position X along the furnace 50 may be shifted according to the values of the location Z in the crucible 74. In other words, the thermal profile 78 is a function of the coordinates X and Z and can be expressed as T(X,Z). The thermal profile 78 includes zones 79 and 75 in which the temperatures T1(X,Z) and T3(X,Z) are above and below melting point Tm, respectively. In a transition zone 77, the temperature T2(X,Z) changes gradually from T1 to T3. Accordingly, the thermal profile 78 showing T(X), which is illustrated as a lateral profile, depends on the parameter Z that shifts the profile 78 towards higher temperatures with the increasing of the values of the parameter Z.

Figure 3:
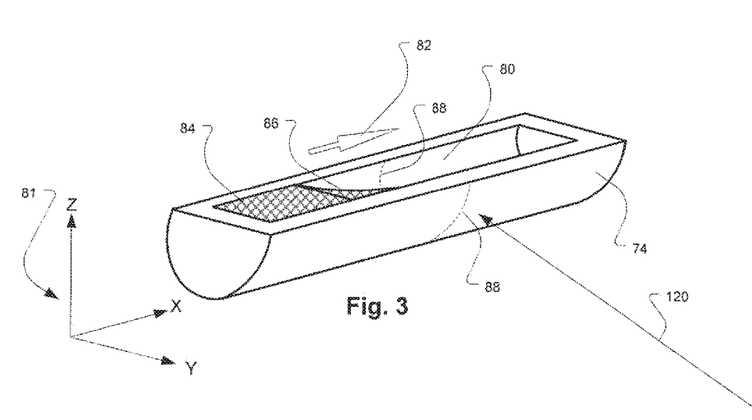
FIGS. 3 and 4 are diagrams of a crucible in accordance with various embodiments.
Figure 4:
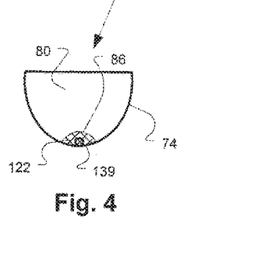
Figure 5:
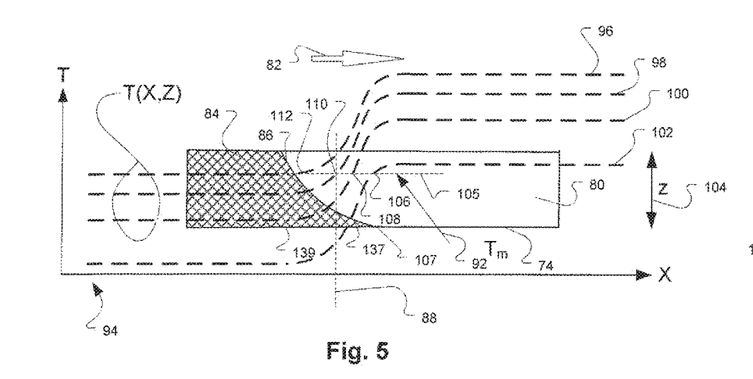
FIG. 5 is a schematic diagram of thermal profiles of the furnace of FIGS. 1 and 2 and the solid-liquid interface produced in accordance with various embodiments.

FIGS. 3-5 schematically illustrate how the vertical thermal gradient affects the shape of the interface 86 between the solid and the liquid parts of the material grown in the crucible 74. In particular, FIG. 3 schematically illustrates the crucible 74 oriented along the X-axis of a coordinate system 81. The internal volume 80 of the crucible 74 contains solid material 84 of the grown crystal (also referred to as the solid part 84 of the crystal growth) and interfaces 86 between the solid material 84 and the liquid material of the grown crystal, which is not shown for the clarity of the drawing. It should be noted that the liquid material that is not shown is located in the part of volume 80 that is not occupied by the solid material 84. The axis 82 of the crystal growth is oriented along the X-direction.

FIG. 5 is a graph 94 illustrating curves T(X,Z) of the temperatures in the furnace 50 of FIGS. 1 and 2 as a function of the locations X and Z inside the furnace 50. The solid material 84, namely the solid part or portion of the grown crystal and the part of internal volume 80 of crucible 74 that does not include solid material 84, which contains the liquid part of the grown material (not shown for the clarity of the drawing) is shown within the graph 94. The interface 86 is the boundary surface between the solid part 84 and the liquid part of the grown material. It should be understood that the solid part 84, the interface 86 and the volume 80 are illustrated schematically for the purpose of illustration and the dimensions and temperatures are not necessarily indicative of actual values and proportions.

The thermal profiles 96, 98, 100 and 102 (illustrated by the curves in the graph 94), which move along the axis 82 have similar shapes, but are shifted relative to each other, in respective temperatures along the Z-direction. The thermal profiles 96, 98, 100 and 102 are illustrated at an arbitrary position, which is not necessarily related to the position of the interface 86. Due to the vertical thermal gradient produced by the furnace 50 (shown in FIGS. 1 and 2), the higher the location along the Z-axis 104 (namely the higher the Z coordinate), the higher the temperatures of the thermal profiles 96, 98, 100 and 102.

Figure 6:
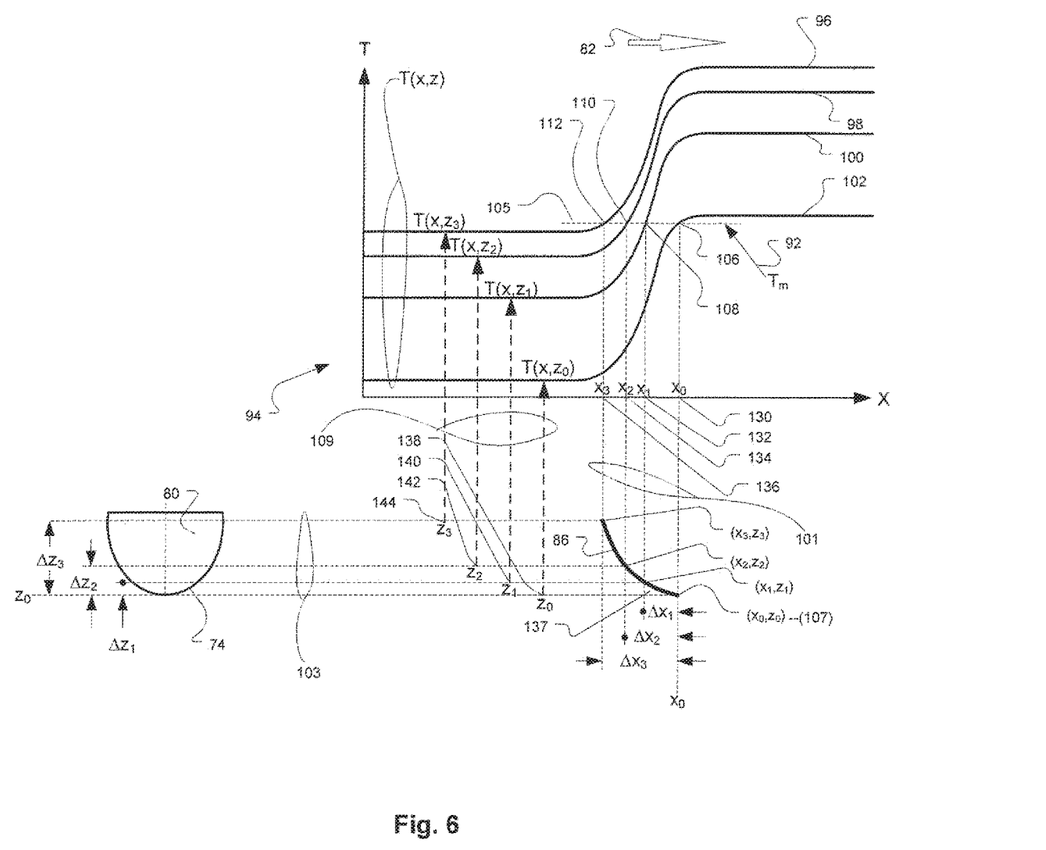
FIG. 6 is a diagram schematically illustrating thermal profiles of the furnace of FIGS. 1 and 2 and the derivation of the shape of the solid-liquid interface produced in accordance with various embodiments.

The arrow 92 pointing to line 105 is the isothermal having a temperature that is equal to the melting temperature Tm of the grown material. The line 105 intersects with the thermal profiles 96, 98, 100 and 102 at points 112, 110, 108 and 106, respectively. Accordingly, the points 112, 110, 108 and 106 all have the temperature Tm that is equal to the melting temperature of the grown material (e.g., generally when the material changes phases), but are different in respective values of the coordinates X and Z. FIG. 6 illustrates how the values of the coordinates X and Z of the points, such as points 112, 110, 108 and 106, determine the shape of the interface 86.

FIG. 4 is a schematic side-view cross-section of the crucible 74, the volume 80 and the interface 86. The arrow 120 illustrates the relationship between FIGS. 3 and 4 showing lines 88 of FIGS. 3 and 5 along which the cut of the cross-section made in FIGS. 3 and 5. FIG. 4 shows the side view of this cut along the lines 88 of FIG. 2. As can see from FIG. 4, the cross section of the interface 86 is a small region within the volume 80. This small region is produced as a result of a sharp leading edge 107 (also referred to as the leading point 107) of the interface 86 and a narrow width of a bottom 139 of the crucible 74. For example, the bottom 139 of the crucible 74 in various embodiments is narrower than a conventional crucible for crystal growth. In some embodiments, the slope of the sides of the crucible is increased to form a narrower bottom 139. The sharpness of the edge of the interface 86 near the leading point 107 is characterized by an angle 137 between the interface 86 and the bottom 139 of crucible 74.

It can be seen from the sharp leading edge 107 of the interface 86 in FIG. 5 and the small region of the cross-section of the interface 86 in FIG. 4 that the growth of the solid part 84 starts in a very small region that may contain a single nucleation center 122. Accordingly, in various embodiments, the interface 86 does not include multiple nucleation centers 34 that lead to the growth of a polycrystalline boule. In particular, in various embodiments, the growth of the crystal in the furnace 50 of FIGS. 1 and 2, which includes vertical gradients oriented along the Z-direction with temperatures increasing with the value of Z, starts in the single nucleation point 122.

The growth provided by the embodiment illustrated in FIGS. 3 and 5 that starts in the single nucleation center 122 having the sharp leading edge the near point 107, which is characterized by the small angle 137, evolves from this center and may keep a crystal-orientation thereof, due to the curve shape of the interface 86.

FIG. 6 illustrates how the vertical gradient produced by the furnace 50 of FIGS. 1 and 2 determines or defines the shape of the interface 86 between the solid and liquid parts of the grown material. The perspective illustration of the crucible 74, having the internal volume 80, is provided to show the orientation of the crucible 74 with respect to the coordinate system 81.

As illustrated, the T(X,Z) coordinate system of the graph 94 includes the curves of the thermal profiles 96, 98, 100 and 102 produced by the furnace 50 of FIGS. 1 and 2, which moves along the X-axis in the direction of the crystal growth illustrated by the arrow 82. Due to the vertical thermal gradient produced by the furnace 50, the curves 96, 98, 100 and 102 are shifted, relative to each other, in respective temperatures in such a way that the higher the Z value, the higher the corresponding temperature.

The curves 96, 98, 100 and 102 are $T(X,Z_3)$, $T(X,Z_2)$, $T(X,Z_1)$ and $T(X,Z_0)$, which are curves T(X) expressing the lateral thermal profiles at locations $Z_3$, $Z_2$, $Z_1$, and $Z_0$, respectively. The arrow 92 pointing to the line 105 again is the isothermal line having a temperature that is equal to the melting temperature Tm of the grown material. The line 105 intersects with the thermal profiles 96, 98, 100 and 102 in points 112, 110, 108 and 106, located at points $(X_3, Z_3)$, ($X_2,Z_2$), ($X_1,Z_1$) and ($X_0,Z_0$), respectively, corresponding to points (144, 136), (142, 134), (140, 132) and (138, 130), respectively.

The points 112, 110, 108 and 106 all have temperatures that are equal to the melting temperature Tm of the grown material and thus, are located in the interface 86 between the solid and the liquid parts of the grown material. The set of lines 101 indicate the position of the points $X_0$, $X_1$, $X_2$, and $X_3$ corresponding to points 130, 132, 134, and 136 of the graph 94, respectively. Similarly, the set of lines 109 and 103 indicate the position of the points $Z_0$, $Z_1$, $Z_2$, and $Z_3$ in the graph 94 corresponding to the thermal curves $T(X,Z_3)$, $T(X,Z_2)$, $T(X,Z_1)$ and $T(X,Z_0)$ of the thermal profiles 96, 98, 100 and 102 of the graph 94, respectively.

Because the points 112, 110, 108 and 106 are located at points $X_3$, $X_2$, $X_1$, and $X_0$, and are also located on the thermal profiles 96, 98, 100 and 102 corresponding to points $Z_3$, $Z_2$, $Z_1$, and $Z_3$, the corresponding location relative to the illustrated crucible 74 may be found by the intersection of the lines in set of line 101 with the lines in the set of lines 103. In addition, because all of the points 112, 110, 108 and 106 have the same temperature Tm, the points may be located on the interface 86 between the solid and the liquid parts of the grown material. Thus, the shape of the interface 86 is determined as explained above, namely by the intersection of the lines in set of lines 101 with the lines in the set of lines 103. As can be seen, the interface 86 passes via the above described intersection points, which are points ($X_3$, $Z_3$), ($X_2,Z_2$), ($X_1$, $Z_1$) and ($X_0,Z_0$) where point ($X_0,Z_0$) corresponds to the leading edge point 107, characterized by the angle 137 of the crystal with growth illustrated by FIG. 5.

The shape of the interface 86 is also determined by the differences $\Delta Z_1$, $\Delta Z_2$ and $\Delta Z_3$ between points $Z_0$, $Z_1$, $Z_2$ and $Z_3$, respectively, along the internal volume 80 of the crucible 74 as is shown in FIG. 6, namely the slope of the vertical gradient produced by the furnace 50 of FIGS. 1 and 2. Similarly, the shape of the interface 86 is also determined by the differences $\Delta X_1$, $\Delta X_2$ and $\Delta X_3$ between points $X_0$, $X_1$, $X_2$ and $X_3$, respectively, namely of the slope of the thermal profiles 102, 100, 98, and 96 produced by the furnace 50 of FIGS. 1 and 2.

Figure 7:
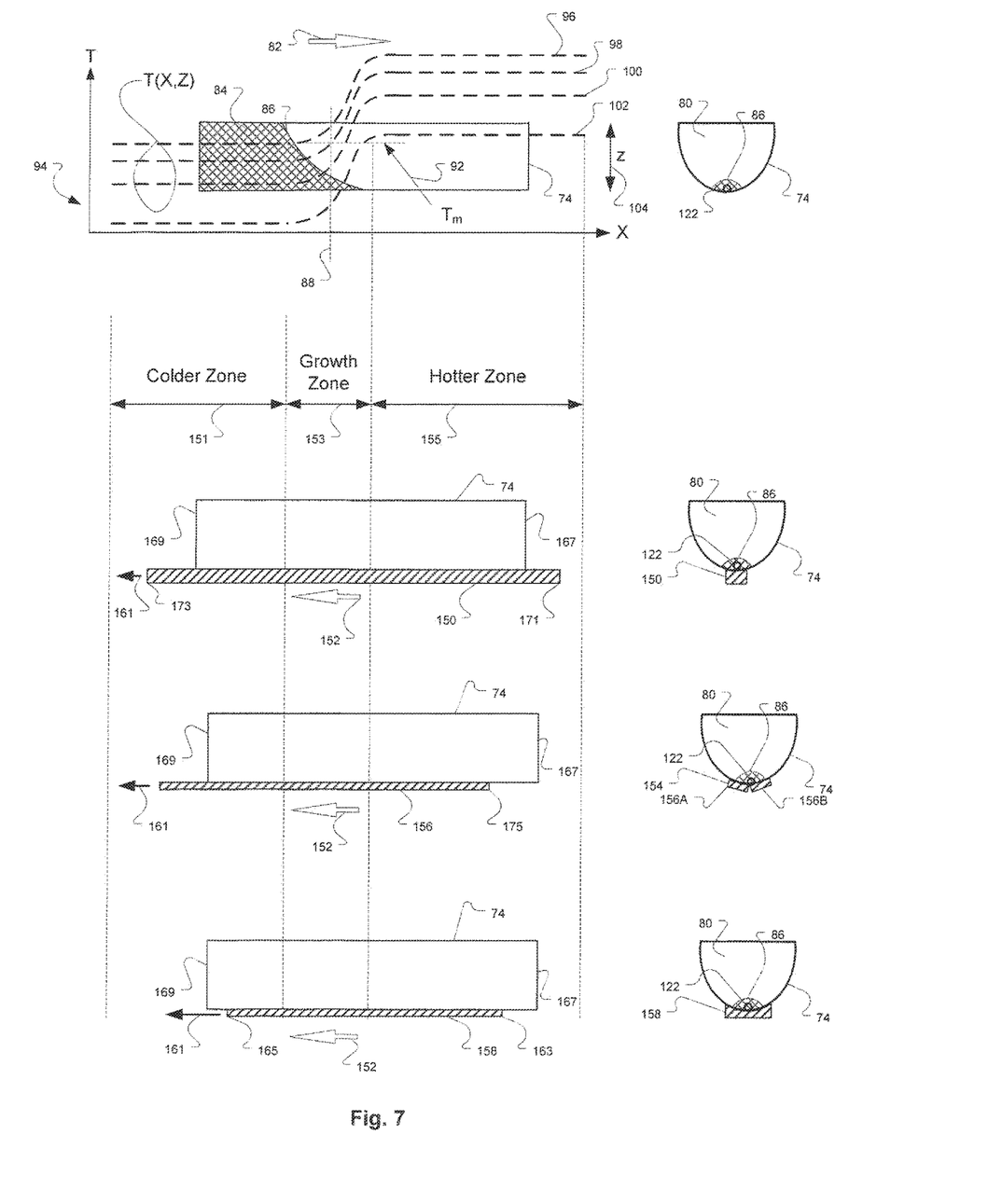
FIG. 7 is a diagram of schematic illustrations of crucibles placed above a heat transfer device in accordance with various embodiments.

From the above, it should be appreciated that the leading point 107 in the interface 86 facilitates improving the crystalline of the grown boule. To further enhance the leading point 107 and to make the leading point 107 more distinct by reducing the value of the angle 137 and having less dependence on the growth position and the thermal conductivity of the grown material, the means as shown in FIG. 7 may be used to ensure (or increase the likelihood) that the leading point 107 may include a single nucleation center. In some embodiments, growth from a single nucleation center is provided when the angle 137 is smaller than about 45 degrees. However, other angles, which may be smaller or larger may be used.

In various embodiments, the interface 86 between the liquid and the solid phases of the grown material has a shape that is not concave or "C" like shape. As described above in connection with the shape formation of the interface 86, when the parameters described above, such as the vertical and lateral thermal gradients, which affect the shape of the interface 86, are controlled, the "C" shape of the interface 86 is avoided in various embodiments.

FIG. 7 illustrates the use of heat guides or radiation guides for enhancing the leading point 107 of FIGS. 4 and 5, which is the leading point of the growth. The graph 94 and the crucible 74 are shown again in this figure to illustrate the thermal zones in the furnace 50 of FIGS. 1 and 2 and to show the relationship to the use of the heat guides or radiation guides.

From FIG. 7, it can be seen that the crucible 74 is placed along three thermal zones, 151, 153 and 155 that are the colder zone, growth zone and hotter zone. The colder zone 151, in which the grown material is in a solid phase, becomes longer as the crystal growth progresses, the growth zone 153 has substantially the same length during the growth and the hotter zone 155 becomes shorter with the progress of the crystal growth.

The thermal profiles 96, 98, 100 and 102 illustrated in the graph 94 produced by controlling the electrical power provided to heating the elements 60 and 61 of FIG. 1 are maintained when the furnace 50 has some heat losses and heat flow exists inside the furnace. It should be noted that if the furnace 50 does not include such heat loss, the electrical power to the heating elements 60 and 61 would drop to zero and the furnace 50 would reach equilibrium leading the inside volume of the furnace 50 to have uniform temperature in all zones. Thus, in various embodiments, to provide the thermal profiles 96, 98, 100 and 102, heat loss and heat flow is provided in connection with the furnace 50.

The heat flow in the furnace 50 depends on the thermal conductivity of the grown material. In some grown materials, such as CZT, the heat conductivity may be low and may be different for the solid and the liquid parts of the grown material. As described above, the lengths of the solid 84 and the liquid parts of the grown material are changed during the growth and thus, change the heat flow inside the furnace 50. The changes of the heat flow in the furnace 50 may change the vertical thermal gradient and the shapes of the profiles 96, 98, 100 and 102, resulting in changes in the shape of the interface 86 and the leading point 107 of FIG. 6. Changes in the shape of the interface 86 may cause the leading point 107, which is the leading point of the crystal growth, to be less dominant and thus the crystal growth may change from being developed from a single nucleation center to multiple nucleation centers.

In various embodiments, the leading point 107 maintains dominance by:

1. Maintaining the edge of the interface 86 of FIGS. 5 and 6 near the leading point 107 to be with the sharp angle 137; and 2. Keeping the leading point 107 of the interface 86 to be the coldest point from which the growth starts.

The above dominance parameters may be provided in some embodiments using a heat transfer device under the crucible 74. FIG. 7 illustrates different heat transfer devices. In particular, a heat transfer device 150 transfers heat from the hotter zone 155 and the growth zone 153 to the colder zone 151 along the direction 152 (illustrated by the arrow). The heat transfer device 150 may be, for example, a heat guide with a thermal conductivity selected from a wide spectrum of thermal conductivities. The device 150 may be made, for example, of pyro-lithic Graphite, Silicon-Carbon or Boron-Nitride, among other materials.

In other embodiments, the heat transfer device 150 may be configured as a radiation guide to guide and emit radiation from the hotter zone 155 and the growth zone 153 toward the colder zone 151 along the direction 161 (illustrated by the arrow). It should be noted the heat transfer by guiding radiation is used in various embodiments at high temperatures, such as the temperatures used to grow crystals. The heat transfer device 150 may be made of rods or hollow pipes that are at least partially made of materials having polished emitting surfaces. For example, the heat transfer device 150 configured as a radiation guide may be made of Quartz.

In operation, when the heat transfer device 150 transfers heat from the hotter zone 155 to the colder zone 151, temperature reduction around the leading point 107 and moving the leading point 107 toward colder the zone 151 are provided, resulting in a smaller angle 137 of the interface 86.

In some embodiments, the heat transfer device 150 includes a width that is narrow enough to produce a sharp edge of the interface 86 near the leading point 107 and wide enough to ensure efficient heat transfer from the zone 155 to the zone 151 as described in more detail herein.

Thus, as schematically illustrated in connection with the heat transfer device 150, the heat transferred by the heat transfer device 150 flows in the direction 152 and/or the radiation that emitted is oriented along the direction 161. It should be noted that this heat transfer and emitted radiation also may be provided by the heat transfer devices 156 and 158 as described below. In one embodiment, the heat transfer device 150 is made of a single rod and is longer than the crucible 74 and thus, edges 171 and 173 of the heat transfer device 150 are located outside edges 167 and 169 of the crucible 74. For the heat transfer device 156, in one embodiment, the heat transfer device 156 is made from a plurality of rods, illustrated as two rods 156A and 156B and only one of the edges 175 of each of these rods is placed under the crucible 74, with the opposite edge extending beyond the edge 169 of the crucible 74. For the heat transfer device 158, in one embodiment, the heat transfer device 158 is made from a rod that is shaped into a form that conforms or fits the structure of the crucible 74 (e.g., having a concave inner surface complementary to the curvature of the bottom of the crucible 74). In this embodiment, both of the edges 163 and 165 of the rod are located under the crucible 74 in between the edges 167 and 169 of the crucible 74.

Figure 8:
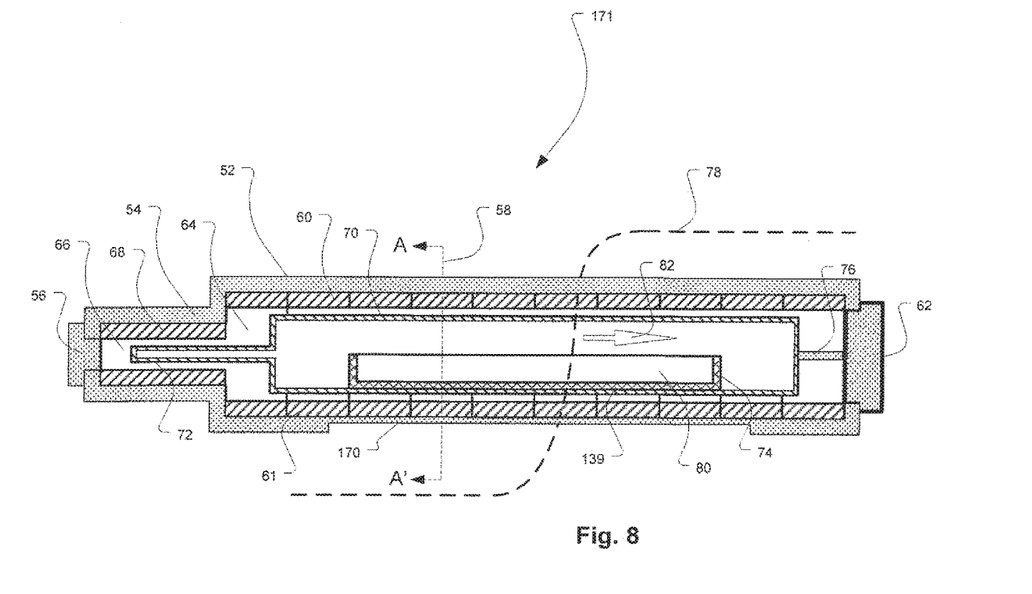
FIGS. 8 and 9 are diagrams schematically illustrating a furnace with a reduced isolation strip in accordance with various embodiments.
Figure 9:
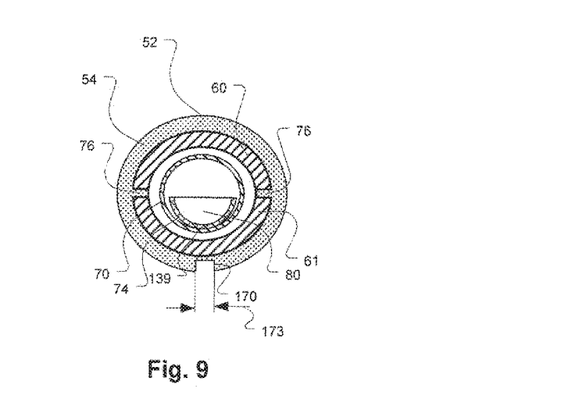

With reference now to FIGS. 8 and 9, these figures schematically illustrate a furnace 171 in accordance with various embodiments in a side view and a cross-section side-view, respectively. The furnace 171 has a structure similar the furnace 50 shown in FIGS. 1 and 2, wherein like numeral represent like parts. The furnace 171 unlike the furnace 50, includes a zone 170 in which the thickness of the thermal isolation material 54 is reduced. The region 170, similar to the heat transfer device 150, is also configured to force the growth of the crystal to start from substantially a single nucleation center.

The reduced thickness of the isolation material 54 in the zone 170 may produce heat loss in this region that is higher than the heat losses in the rest of the regions of the furnace 171. Accordingly, the extra heat loss in the region 170, results in a temperature reduction in the furnace 171 above the region 170. In one embodiment, a width 173 of the region 170 is configured to be narrow enough to ensure that the cooling effect above the region 170 in the furnace 171 is focused into the desired region at the bottom 139 of the crucible 74 illustrated by FIGS. 5 and 8. Accordingly, the region 170 in various embodiments may have a strip like shape.

The heat loss caused by the region 170 and the cooling effect that the region 170 produces may be similar, as described above, to the cooling effect produced by the heat transfer devices 150, 156 and 158 (shown in FIG. 7). Accordingly, the region 170 affects the temperature of the leading point 107 and the angle 137 (shown in FIGS. 5 and 6) of the leading point 107 of the interface 86 such that the growth of the crystal in various embodiments starts from substantially a single nucleation center and as described in more detail above with respect to the heat transfer devices 150, 156 and 158.

Figure 10:
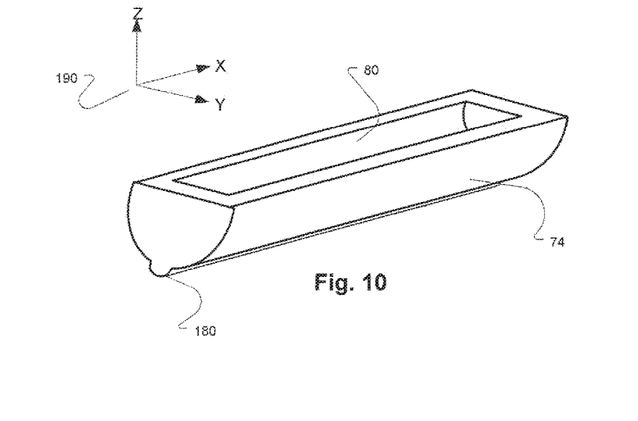
FIGS. 10 and 11 are diagrams of a crucible having a channel in accordance with various embodiments.
Figure 11:
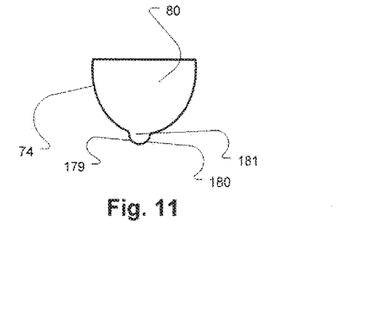

Variations and modifications are contemplated. For example, FIGS. 10-14 are schematic illustrations of different configurations for the crucible 74, which may enhance the leading point 107 in the interface 86. As described in more detail herein, a single nucleation center such as the nucleation center 122 of FIG. 4 may be provided when the leading edge of the growth near the leading point 107 is narrow. To provide this narrow leading edge, the angle 137 (shown in FIG. 5) is made small and the bottom 139 of the crucible 74 is made narrow as also described herein. For example, FIGS. 10 and 11 show the crucible 74 oriented along an X-axis of a coordinate system 190. The crucible 74 includes, at a bottom thereof, a channel 180 extending along the length of the crucible 74 defined by a protrusion along the bottom (e.g., lower side of the bottom). The volume 181 of the channel 180 is part of the total internal volume 80 of the crucible 74. The channel 180 in various embodiments is narrow enough to cause the leading edge of the growth in the interface 86 near the leading point 107 to be small enough to allow only one nucleation center. The channel 180 may have different widths and depths as desired or needed. Thus, the channel 180 may be wider or narrower, as well as deeper or shallower.

While the narrow shape of the channel 180 can improve the crystalline of the grown crystal, the shape of an internal surface 179 may induce the creation of a parasitic (spontaneous) nucleation. The parasitic nucleation induced by the surface 179 may also depend on the aspect ratio between the volume 181 and the surface 179 of the channel 180. Accordingly, the shape and the size of the channel 180 may be selected for providing improved crystalline quality of the grown crystal, such as based on the type of crystal to be grown.

Figure 12:
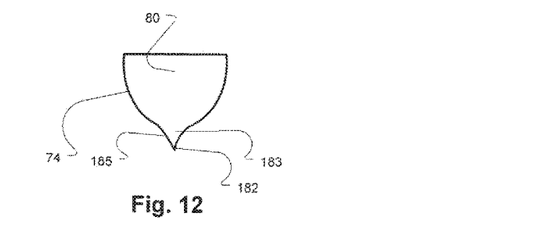
FIGS. 12-14 are diagrams of crucibles having channels in accordance with other various embodiments.
Figure 13:
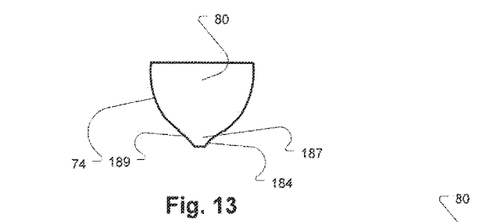
Figure 14:
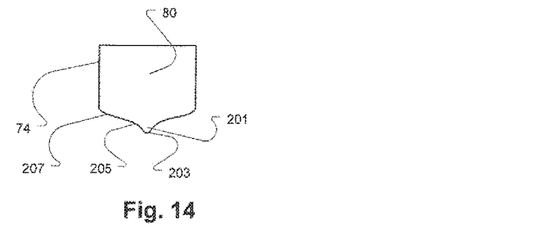

For example, FIGS. 12-14 illustrate additional shapes and sizes of channels 182, 184 and 203 having volumes 183, 187 and 201 and surfaces 185, 189 and 205, respectively. The different shapes of the surfaces 179, 185, 189 and 205 of the channels 180, 182, 184 and 203, respectively may create different wetting due to the surface tension of the liquid part of the grown material and thus the shape of channels 180, 182, 184 and 205 in various embodiments are selected in a way to reduce or minimize nucleation. Thus, although the channel 182 is generally pointed, the channel 184 includes generally planar bottom and the channel 203 gradually slopes from planar walls of the crucible 74, different shapes and configurations of channels may be provided.

It should be noted that the sloping generally flat bottom 207 including the channel 203 of FIG. 14 allows an improved ration between the volume 80 of the crucible 74 and the surface of the crucible 74 for growing heavier ingots.

Various embodiments have been described separately. For example, the vertical thermal gradient that is added to the lateral thermal profile, the heat transfer devices 150, 156 and 158 of FIG. 7, the reduced isolation strip 170 of FIGS. 8 and 9 and the additional channels of FIGS. 10-12, which all may be used, for example, to improve the crystalline quality of the grown crystals. However, while some of these methods and embodiments have been described separately, it should be understood that any combination of these methods and embodiments may be used at the same time in the same structure.

Variations and modifications are also contemplated. For example, while the various embodiments are described in connection with forming a CZT crystal, it should be understood that any type of crystal may be formed. Also, while one or more components are described as being made of one or more materials, different materials and combinations of materials may be used. For example, the heat guide may be made from any type of material. Also, while the radiation guide is described as being made in certain shapes, it should be understood that other shapes may be provided. Additionally, while the region with the reduced isolation in the furnace is described as having a strip like shape, it should be understood that other shapes may be provided. Moreover, while the channel at the bottom of the crucible is described as having certain shapes, it should be understood that other shapes may be provided.

Figure 15:
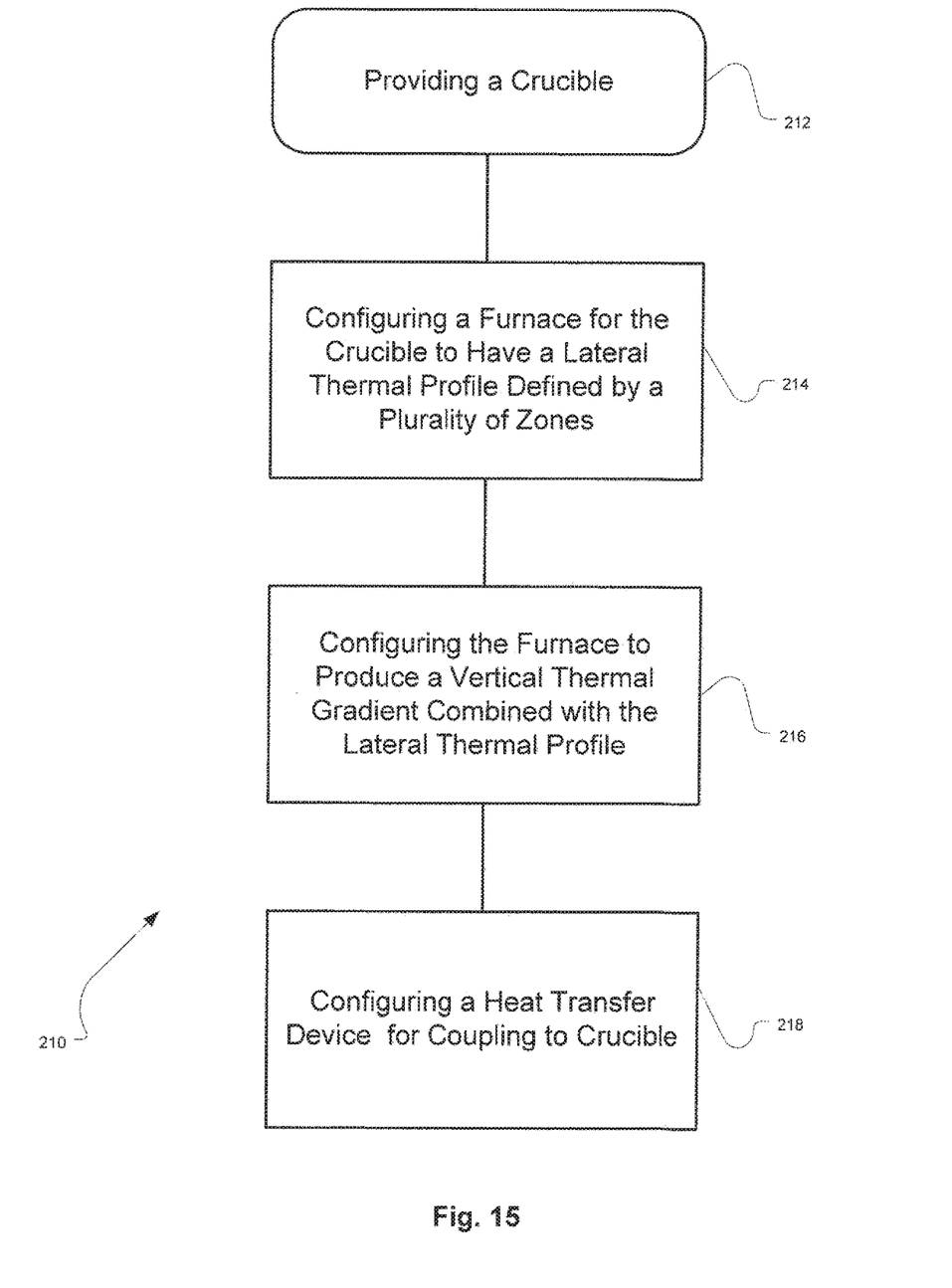
FIG. 15 is a flowchart of a method for growing a crystal in accordance with various embodiments.

Various embodiments also provide a method 210 as shown in FIG. 15 for growing a crystal, such as using a MHB process, which is described in connection with configuring a system to grow a crystal. The method 210 includes providing at 212 a crucible having a first volume to receive therein material for growing a crystal. The crucible generally has a narrow bottom, such as a narrower region and which may also include a channel as described herein. The method 210 also includes at 214 configuring a furnace to receive therein the crucible and to produce a lateral thermal profile having a first zone, a second zone and a third zone. In various embodiments, the first and second zones have temperatures above and below a melting point of the material, respectively, and the second zone has a temperature that is equal (or substantially equal) to the melting point of the material and contains a solid-liquid interface of the material. It should be noted that the temperature in the second zone in some embodiments is approximately equal to the melting point of the material. The melting point of the material generally varies based on the material. In various embodiments, the melting point is generally the point at which the material phase changes.

The method 210 also includes configuring the furnace at 216 to produce a vertical thermal gradient and to combine the lateral thermal profile with the vertical thermal gradient. The thermal gradient causes one point in the bottom of the crucible located in the third zone to be the coldest point in the crucible. The method 210 additionally includes configuring at 218 a heat transfer device to be coupled to (e.g., under) the crucible to transfer heat from the third and second zones to the first zone to produce, in the narrow bottom, a narrow sharp leading edge of the interface to create substantially a single nucleation center in the leading edge. The crystal the may be grown, for example, using an MHB process.

It should be noted that the steps of the method 210 may be performed in any order. Additionally, some of the steps may be performed concurrently or simultaneously and are not necessarily performed sequentially.

Thus, various embodiments provide methods and devices for growing crystals.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, the embodiments are by no means limiting and are exemplary embodiments. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal languages of the claims.

What is claimed is:

1. A system for growing a crystal, the system comprising:
   a crucible having a first volume to receive therein a material for growing a crystal;
   a furnace including heating elements and a sealed ampoule, the ampoule interposed between the heating elements and the crucible, the ampoule configured to receive the crucible within the ampoule, the furnace also configured to produce a lateral thermal profile combined with a vertical thermal gradient; and
   a heat transfer device disposed under the crucible and within the sealed ampoule, the heat transfer device configured to produce a leading edge of growth of the crystal at a bottom of the crucible, the heat transfer device comprising at least one elongate member disposed beneath the crucible and extending along a length of the crucible, the at least one elongate member disposed within the sealed ampoule and interposed between the crucible and the ampoule, wherein the at least one elongate member comprises at least one of a rod or a pipe.

2. The system of claim 1, wherein the bottom of the crucible has a narrower profile.

3. The system of claim 1, wherein the crucible further comprises a channel extending along a lower side of the bottom of the crucible.

4. The system of claim 3, wherein the channel is one of a concave shape or a planar shape.

5. The system of claim 1, wherein the lateral thermal profile includes a first zone, a second zone and a third zone, wherein the first and third zones have temperatures above and below a melting point of the material, respectively, and the second zone has, a plurality of temperatures with at least one temperature equal to the melting point of the material and containing a solid-liquid interface of the material, wherein the thermal gradient causes a point in the bottom of the crucible located in the third zone to be the coldest point in the crucible.

6. The system of claim 1, wherein the heat transfer comprises transfer of heat from the first and second zones to the third zone to produce the leading edge to create substantially a single nucleation center in the leading edge for growing the crystal.

7. The system of claim 1, wherein the heat transfer device comprises one of a heat guide or a radiation guide.

8. The system of claim 1, wherein the furnace further comprises one or more sets of heating elements wherein the sets of heating elements comprise upper and lower heating elements and the upper heating elements are hotter than the lower heating elements.

9. The system of claim 1, wherein the at least one elongate member comprises a material that has a thermal conductivity that is higher than the thermal conductivity of quartz.

10. The system of claim 1, wherein at least one end of the at least one elongate member does not extend past the crucible.

11. The system of claim 1, wherein the at least one elongate member comprises plural elongate members interposed between the crucible and the ampoule.

* * * * *